(12) United States Patent
Fujii

(10) Patent No.: US 6,707,130 B2
(45) Date of Patent: Mar. 16, 2004

(54) BIPOLAR DEVICE WITH POLYCRYSTALLINE FILM CONTACT AND RESISTANCE

(75) Inventor: Hidenori Fujii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/279,055

(22) Filed: Oct. 24, 2002

(65) Prior Publication Data

US 2003/0222277 A1 Dec. 4, 2003

(30) Foreign Application Priority Data

May 31, 2002 (JP) ........................................ 2002-159015

(51) Int. Cl.$^7$ ...................... H01L 29/732; H01L 27/082
(52) U.S. Cl. .................. 257/588; 257/365; 257/577; 257/592
(58) Field of Search ............................... 257/565, 577, 257/587, 588, 592

(56) References Cited

U.S. PATENT DOCUMENTS

| | | | |
|---|---|---|---|
| 4,579,600 A | * | 4/1986 | Shah et al. ................ 257/577 |
| 4,977,098 A | * | 12/1990 | Yu et al. .................... 257/565 |
| 5,541,124 A | * | 7/1996 | Miwa et al. ................ 257/588 |
| 5,582,640 A | | 12/1996 | Okada et al. |
| 5,701,029 A | * | 12/1997 | Sasaki ........................ 257/588 |
| 6,051,872 A | * | 4/2000 | Kaneko et al. ............. 257/587 |
| 6,114,744 A | * | 9/2000 | Kawaguchi et al. ........ 257/587 |

FOREIGN PATENT DOCUMENTS

JP  2001-77316  3/2001

* cited by examiner

Primary Examiner—Gene M. Munson
(74) Attorney, Agent, or Firm—Leydig, Voit & Mayer, Ltd.

(57) ABSTRACT

A first dopant impurity producing a conductivity type for formation of an intrinsic base diffusion layer and a dopant impurity producing the opposite conductivity type are implanted into a semiconductor substrate. An exposed surface of the semiconductor substrate is irradiated with a plasma, so that many crystalline defects are produced. Next, a polysilicon film is formed under conditions that cause the grain size to increase. In a portion of the polysilicon film located near the exposed surface of the semiconductor substrate, the grain size becomes relatively small, influenced by the crystalline defects in the substrate surface. In a portion of the polysilicon film located on the silicon oxide film, the grain size becomes relatively large, uninfluenced by the crystalline defects. Thus, degradation of electrical characteristics is suppressed, and variation in resistance of the resistance element is alleviated.

8 Claims, 19 Drawing Sheets

BIPOLAR DEVICE WITH POLYCRYSTALLINE FILM CONTACT AND RESISTANCE

BACKGROUND OF THE INVENTION

1. Field of the Invention

The present invention relates to semiconductor devices and manufacturing methods thereof, and more particularly to a semiconductor device provided with a bipolar transistor and a resistance element and a manufacturing method thereof.

2. Description of the Background Art

A conventional method of manufacturing a semiconductor device provided with a bipolar transistor is explained. As shown in FIG. 19, a semiconductor substrate 101 has an element forming region A partitioned by a field oxide film 103, in which an external base extracting electrode 104 is formed.

A dopant impurity for formation of an external base diffusion layer is implanted from above external base extracting electrode 104. Thereafter, a silicon oxide film 105 is formed. Silicon oxide film 105 is subjected to etching, so that an opening for formation of a base region is formed. During the etching, the surface of semiconductor substrate 101 is etched to a certain extent.

A heat treatment is conducted to cause the impurity implanted in external base extracting electrode 104 to diffuse into semiconductor substrate 101, so that an external base diffusion layer 107 is formed. At this time, a relatively thin silicon oxide film 108 is formed on the exposed surface of semiconductor substrate 101 and others.

Next, a dopant impurity for formation of an intrinsic base diffusion layer is implanted. A silicon oxide film is formed to cover the opening, which is subjected to anisotropic etching, so that a sidewall oxide film 109 is formed. At this time, in a peripheral region B, silicon oxide film 105 has been formed on field oxide film 103.

Next, as shown in FIG. 20, a polysilicon film (or, amorphous silicon film) 110 is formed on silicon oxide film 105. Arsenic is implanted into polysilicon film 110. Next, as shown in FIG. 21, prescribed etching is conducted to form an emitter extracting electrode 110a in element forming region A and to form a resistance element 110b in peripheral region B. Thereafter, an interlayer silicon oxide film 111 is formed to cover emitter extracting electrode 110a and resistance element 110b.

A further heat treatment is conducted. The prescribed impurity having been implanted is diffused, so that an intrinsic base diffusion layer 112 is formed. At the same time, the arsenic having been implanted into emitter extracting electrode 110a is diffused into semiconductor substrate 101, so that an emitter diffusion layer 113 is formed. In addition, resistance element 110b is activated.

Next, as shown in FIG. 22, interlayer silicon oxide film 111 is subjected to etching, so that contact holes 111a–111e are formed. Next, as shown in FIG. 23, a collector electrode 117, an emitter electrode 116 and a base electrode 115 are formed in contact holes 111a–111c, respectively, in element forming region A. In peripheral region B, an electrode 118 connected to resistance element 110b is formed in each contact hole 111d, 111e. The semiconductor device having a bipolar transistor is thus formed.

As described above, with the conventional method of manufacturing the semiconductor device provided with a bipolar transistor, emitter extracting electrode 110a and resistance element 110b are formed from the same polysilicon film 110. This polysilicon film 110 includes an aggregation of a large number of crystals, and each crystal is called a grain.

The impurity, such as arsenic, implanted into polysilicon film 110 is more likely to diffuse along the grain boundaries between the grains.

In recent years, with advancement of miniaturization of semiconductor devices, an exposed region of semiconductor substrate 101 for formation of emitter diffusion layer 113 has been reduced, as shown in FIG. 24, with fewer grains located in the exposed region. The fewer grains located therein means fewer grain boundaries located in or in contact with the relevant region.

Further, along with the miniaturization, the temperature for heat treatment has been lowered, or the time for the heat treatment has been reduced, making diffusion of the impurity less intense.

Consequently, the impurity implanted into polysilicon film 110 for formation of the emitter diffusion layer cannot diffuse sufficiently to a predetermined depth from the exposed surface of semiconductor substrate 101, resulting in an undesirably shallow emitter diffusion layer 113.

Such a shallow emitter diffusion layer 113 degrades electrical characteristics, thereby causing increased leakage of base current, reduction of current gain hFE, decreased breakdown voltage between emitter and base, and other problems.

On the other hand, in resistance element 110b, as shown in FIG. 25, variation in grain size would cause variation in resistance value, thereby degrading precision in resistance value of resistance element 110b.

SUMMARY OF THE INVENTION

The present invention has been made to solve the above problems. An object of the present invention is to provide a semiconductor device suffering less degradation of the above-described electric characteristics and less variation in resistance value of the resistance element. Another object of the present invention is to provide a manufacturing method of such a semiconductor device.

The semiconductor device according to an aspect of the present invention includes a first impurity region of a first conductivity type, a second impurity region of a second conductivity type, an insulating film, an opening, and a conductive portion. The first impurity region of the first conductivity type is formed in a main surface of a semiconductor substrate. The second impurity region of the second conductivity type is formed in a surface of the first impurity region to be surrounded by the first impurity region from below and from all sides. The insulating film is formed on the semiconductor substrate to cover the first impurity region and the second impurity region. The opening is formed in the insulating film to expose a surface of the second impurity region. The conductive portion is formed on the insulating film and fills the opening, and is electrically connected to the second impurity region. The conductive portion is formed of a polycrystal film. A portion of the polycrystal film located at a bottom of the opening and contacting the surface of the second impurity region has a grain size that is smaller than a grain size of a portion of the polycrystal film located on an upper surface of the insulating film.

With such a structure, when the second impurity region is formed in the first impurity region in the main surface of the semiconductor substrate by prescribed impurity introduced into the conductive portion, the impurity diffuses from the grain boundaries of the polycrystal film forming the conductive portion through the surface of the first impurity region. At this time, as the grain size of the polycrystal film in the portion located at the bottom of the opening is smaller than the grain size of the portion located on the upper surface of the insulating film, a larger number of grain boundaries come into contact with the surface of the first impurity region. Accordingly, the impurity diffuses through the surface of the first impurity region sufficiently down to a prescribed depth in the first impurity region, so that the second impurity region of a desired depth is formed. As a result, degradation of electrical characteristics including leakage current and breakdown voltage is suppressed. Herein, the grain size is defined as a reciprocal of the number of grains per unit length, as will be described later.

The opening is formed to have a prescribed width and a depth greater than the prescribed width, and the grain size in the portion contacting the surface of the second impurity region is preferably smaller than the prescribed width.

Thus, there are a larger number of grain boundaries at the bottom of the opening, and the impurity sufficiently diffuses from the polycrystal film into the semiconductor substrate region. This ensures that the second impurity region of a desired depth is formed.

The semiconductor device preferably includes a resistance element formed on the insulating film from the same layer as the conductive portion, and the resistance element has one grain in a film thickness direction.

Thus, the grain size of the polycrystal film forming the resistance element becomes relatively large, so that variation in resistance value is decreased.

Further, the semiconductor device preferably includes a third impurity region of the second conductivity type formed in the main surface of the semiconductor substrate to surround the first impurity region from below and from all sides thereof.

In this case, a bipolar transistor having the first impurity region as a base, the second impurity region as an emitter and the third impurity region as a collector is formed. In particular, since the second impurity region forming the emitter has a desired depth, degradation of electrical characteristics in the bipolar transistor, including leakage of base current, reduction of current gain hFE and a decrease of breakdown voltage between emitter and base, is suppressed.

The first one of the manufacturing methods of a semiconductor device according to another aspect of the present invention includes the following steps. A first impurity region of a first conductivity type is formed on a semiconductor substrate. An insulating film is formed on the semiconductor substrate. An opening is formed in the insulating film to expose a surface of the first impurity region. Crystal defect are produced in the exposed surface of the first impurity region by applying damage thereto. A polycrystal film is formed on the insulating film and on the exposed surface of the first impurity region. Prescribed impurity of a second conductivity type is introduced into the polycrystal film. The prescribed impurity introduced into the polycrystal film is caused to diffuse from the surface of the first impurity region to an inside thereof to form a second impurity region of the second conductivity type. A conductive portion electrically connected to the second impurity region is formed by processing the polycrystal film.

According to this manufacturing method, an increased number of crystal defects are produced in the exposed surface of the first impurity region (semiconductor substrate). Accordingly, even if the polycrystal film is deposited under the conditions causing the grain size to increase, a portion of the polycrystal film formed in the vicinity of the exposed surface of the first impurity region has a relatively small grain size influenced by the crystal defects produced in the surface of the first impurity region, and thus, an increased number of grain boundaries come into contact with the surface of the first impurity region. As such, the prescribed impurity diffuses from the grain boundaries through the surface of the first impurity region sufficiently down to a prescribed depth in the first impurity region, so that the second impurity region of a desired depth is formed. As a result, degradation of electrical characteristics including leakage current and breakdown voltage otherwise caused by a shallow second impurity region can be suppressed.

The second one of the manufacturing methods of a semiconductor device according to the another aspect of the present invention includes the following steps. A first impurity region of a first conductivity type is formed on a semiconductor substrate. An insulating film is formed on the semiconductor substrate. An opening is formed in the insulating film to expose a surface of the first impurity region. A polycrystal film is formed to cover the insulating film and to fill the opening. Prescribed impurity of a second conductivity type is introduced into the polycrystal film. Promoting impurity for promoting growth of grains is introduced into the polycrystal film from above the polycrystal film. The grains of the polycrystal film are caused to grow. The prescribed impurity introduced into the polycrystal film is caused to diffuse from the surface of the first impurity region to an inside thereof to form a second impurity region of the second conductivity type. A conductive portion electrically connected to the second impurity region is formed by processing the polycrystal film.

According to this manufacturing method, at the time when the promoting impurity for promoting growth of the grains of the polycrystal film is being introduced, it is introduced relatively easily into the portion of the polycrystal film located on the insulating film, while it is hardly introduced into the portion located inside the opening and contacting the surface of the first impurity region. Accordingly, even if the polycrystal film is being formed under the conditions making the grain size relatively small, the grains in the portion of the polycrystal film located on the insulating film grow and become large. By comparison, the grains in the portion contacting the surface of the first impurity region hardly grow, and thus, a large number of grain boundaries come into contact with the surface of the first impurity region. As such, the prescribed impurity diffuses from the grain boundaries through the surface of the first impurity region sufficiently down to a prescribed depth in the first impurity region, so that the second impurity region is formed with a desired depth. As a result, degradation of electrical characteristics including leakage current and breakdown voltage otherwise caused by a shallow second impurity region can be suppressed.

Specifically, in the step of introducing the promoting impurity into the polycrystal film, a transition metal is preferably implanted as the promoting impurity.

Thus, it is readily possible to promote the growth of the grains of the polycrystal film by simply applying a heat treatment thereto.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
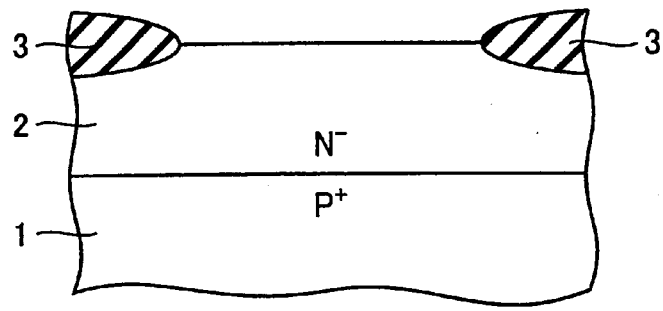
FIGS. 1, 2, 3, 4, 5, 6, 7, 8, 9, 10, and 11 are cross sectional views showing successive steps of the manufacturing method of a semiconductor device according to a first embodiment of the present invention.

The manufacturing method of a semiconductor device according to the first embodiment of the present invention is now described. Firstly, as shown in FIG. 1, an N$^-$ epitaxial layer 2 is formed on a semiconductor substrate 1. A field oxide film 3 for partition of an element forming region is formed in N$^-$ epitaxial layer 2.

Figure 2:
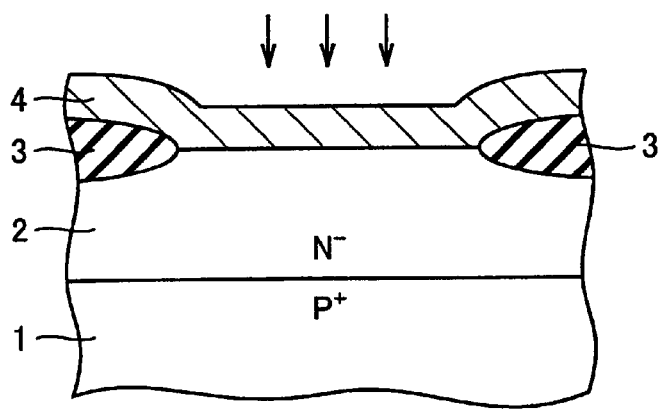

Next, a polysilicon film (not shown) having a film thickness of about 100–400 nm (1000–4000 Å) is formed on semiconductor substrate 1 by CVD (Chemical Vapor Deposition), for example. Thereafter, as shown in FIG. 2, prescribed impurity for formation of an external base diffusion layer, e.g., boron (B) or boron difluoride (BF$_2$), is implanted into the polysilicon film under the conditions of implant energy of 20 KeV to 50 KeV and a dose of $1 \times 10^{14}/cm^2$ to $1 \times 10^{16}/cm^2$. The polysilicon film is subjected to prescribed etching, so that an external base extracting electrode 4 is formed.

Figure 3:
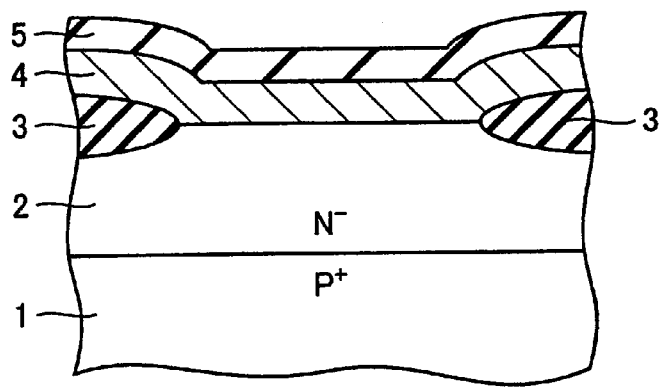

Next, as shown in FIG. 3, a silicon oxide film 5 having a film thickness of about 100–400 nm (1000–4000 Å) is formed on semiconductor substrate 1 by CVD, for example, to cover external base extracting electrode 4.

Figure 4:
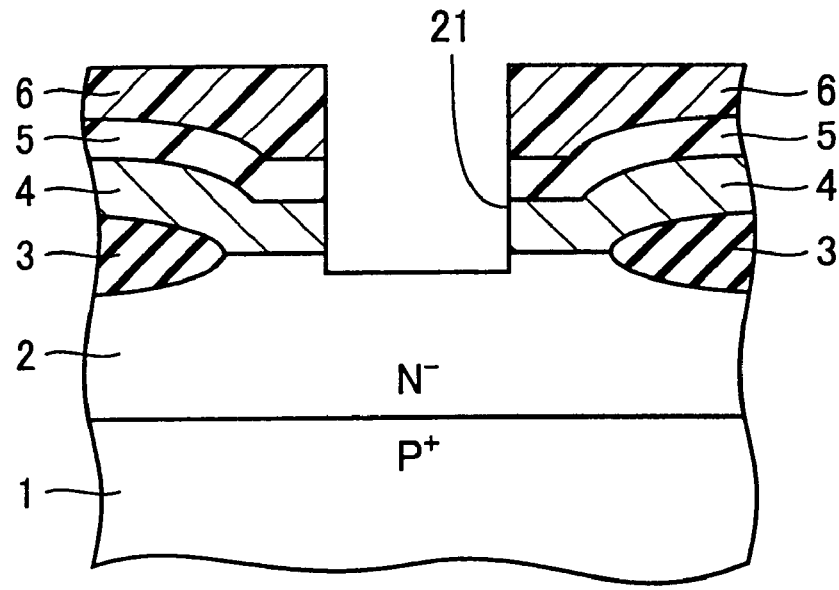

Next, as shown in FIG. 4, a prescribed resist pattern 6 is formed on silicon oxide film 5. Silicon oxide film 5 and external base extracting electrode 4 are subjected to anisotropic etching with resist pattern 6 as a mask, so that an opening 21 to be a base region is formed.

Figure 5:
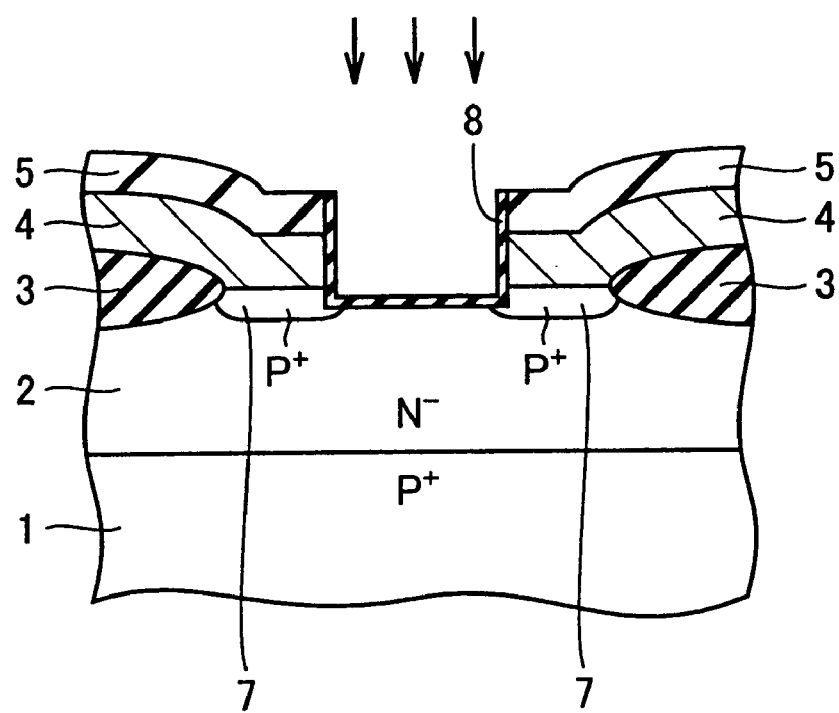

Next, as shown in FIG. 5, an oxidation treatment is conducted at a temperature of, e.g., 800–900° C. for about an hour. This causes boron or the like implanted into external base extracting electrode 4 to diffuse from the surface of N$^-$ epitaxial layer 2 to the inside thereof, so that an external base diffusion layer 7 is formed. At this time, a relatively thin silicon oxide film 8 is formed on the exposed surface of N$^-$ epitaxial layer 2 and others.

Next, boron (B) or boron difluoride (BF$_2$), for example, is implanted into N$^-$ epitaxial layer 2 under the conditions of implant energy of 20 KeV to 50 KeV and a dose of $1 \times 10^{13}/cm^2$ to $1 \times 10^{15}/cm^2$. This implantation is done for linkage between external base diffusion layer 7 and an intrinsic base diffusion layer that will be formed later (link base implantation).

Figure 6:
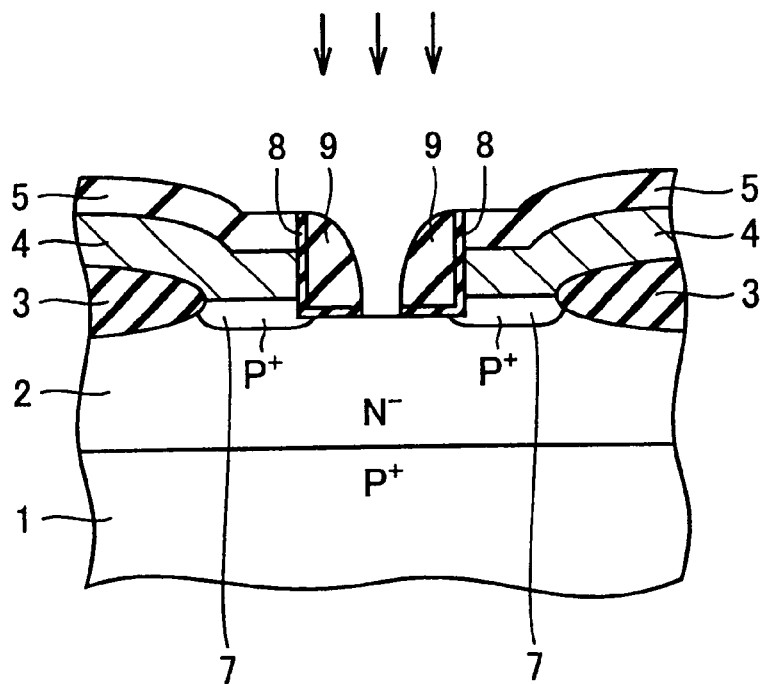

Thereafter, a silicon oxide film (not shown) having a film thickness of about 100–500 nm (1000–5000 Å) is formed on silicon oxide film 5 by CVD, for example. The silicon oxide film is subjected to anisotropic etching (etch back) using an oxide film etching device under the condition of relatively large power of, e.g., 300–1000 W, to expose the surface of N$^-$ epitaxial layer 2, so that a sidewall oxide film 9 is formed, as shown in FIG. 6. The surface of N$^-$ epitaxial layer 2 is thus exposed as an emitter opening 22.

Figure 7:
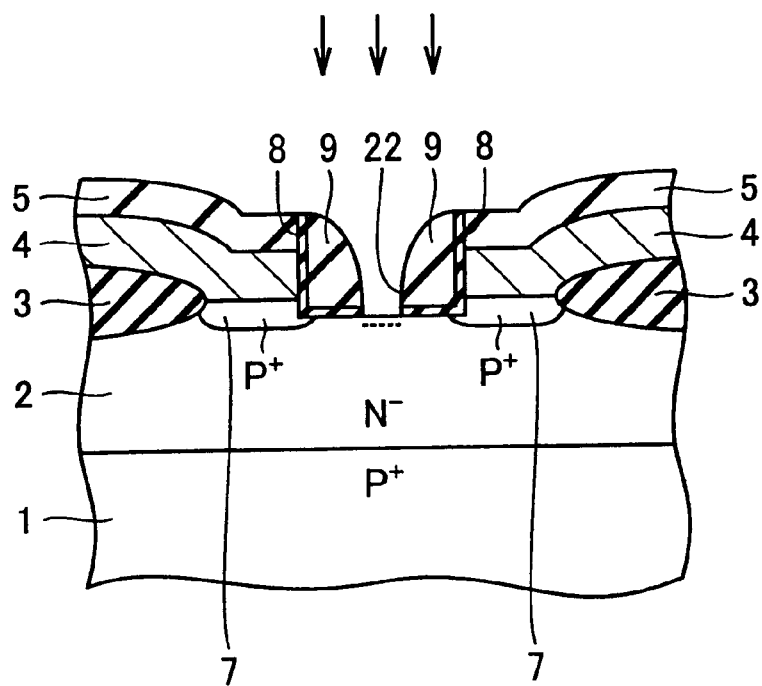

Next, as shown in FIG. 7, impurity for formation of an intrinsic base diffusion layer, e.g., boron (B) or boron difluoride (BF$_2$), is implanted into N$^-$ epitaxial layer 2, under the conditions of implant energy of 20 KeV to 50 KeV and a dose of $1 \times 10^{14}/cm^2$ to $1 \times 10^{16}/cm^2$ (intrinsic base implantation).

Next, impurity of a conductive type opposite to that of the impurity forming the intrinsic base diffusion layer, e.g., antimony (Sb), arsenic (As) or nitride (N), is implanted into N$^-$ epitaxial layer 2 under the conditions of relatively low implant energy of 5 KeV to 15 KeV and a relatively small dose of $1 \times 10^{11}/cm^2$ to $1 \times 10^{13}/cm^2$.

Further, a plasma processing device for use in removal of resist or the like is employed to irradiate the exposed surface of N$^-$ epitaxial layer 2 with plasma, under the condition of relatively large power of 800–1500 W, for example.

The implantation, etching and plasma processing as described above cause damages to the exposed surface of N$^-$ epitaxial layer 2, thereby producing more crystal defects therein.

Figure 8:
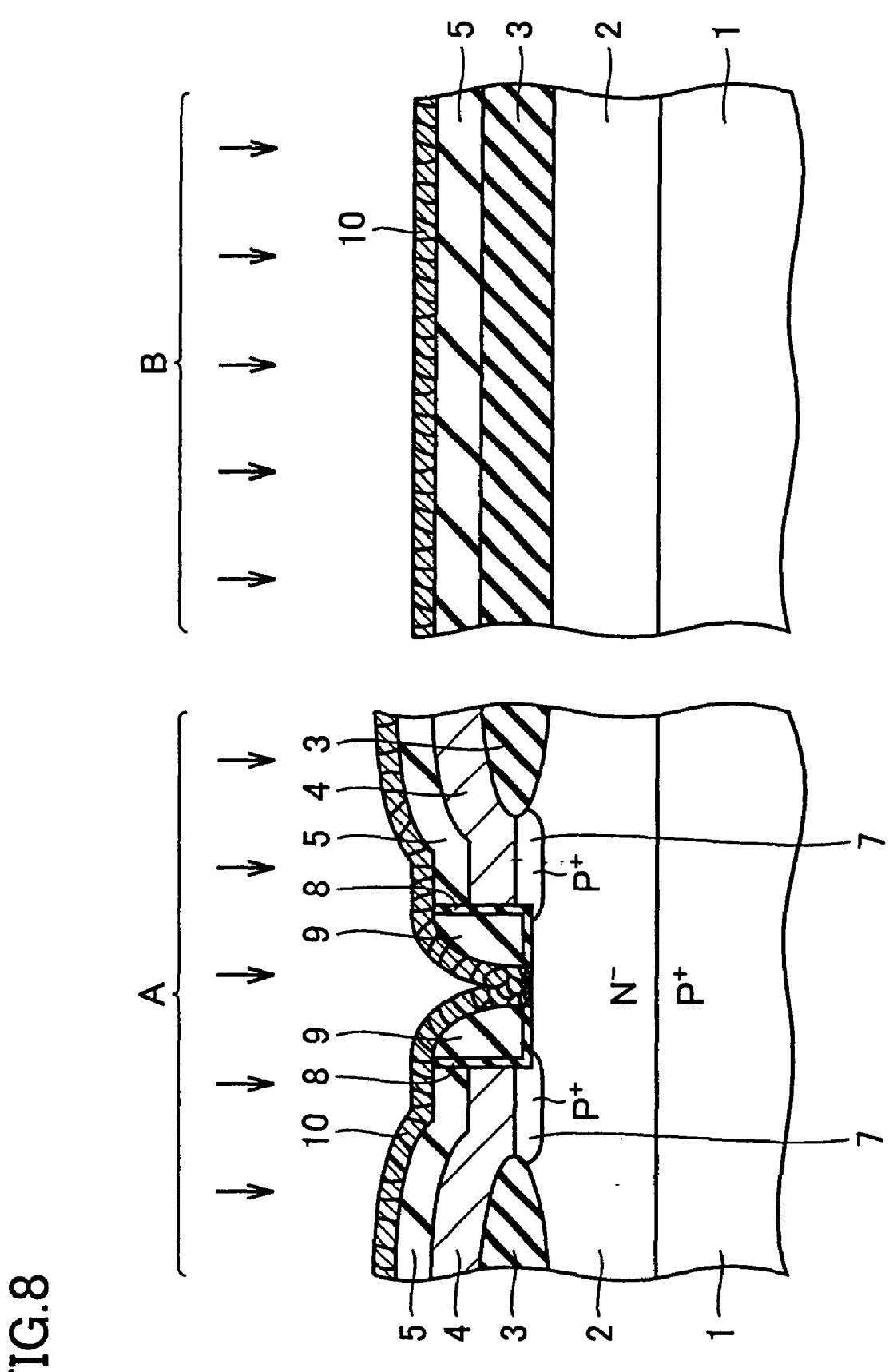

Next, as shown in FIG. 8, a polysilicon film (or amorphous silicon film) 10 of a film thickness of about 100–400 nm (1000–4000 Å) is formed on silicon oxide film 5 by CVD, under the conditions allowing the grain size to increase with respect to the film thickness, e.g., at a relatively low temperature of 400–650° C.

At this time, in a portion of polysilicon film 10 located in the vicinity of the exposed surface of N$^-$ epitaxial layer 2, the grain size becomes relatively small influenced by the crystal defects produced in the exposed surface.

The grain size in the relevant portion is preferably smaller than the shorter side of the size (emitter size) of the exposed surface of N$^-$ epitaxial layer 2, as will be described later in the second embodiment.

On the other hand, in a portion of polysilicon film 10 located on silicon oxide film 5, the grain size becomes relatively large without the influence of the crystal defects. Similarly, in a portion of polysilicon film 10 located in peripheral region B, the grain size is relatively large uninfluenced by the crystal defects. Particularly, in these portions, it is desirable that one grain is formed in a film thickness direction.

Herein, the grain size is defined as an average grain size as follows. Based on the information (e.g., an electron micrograph) of the surface of a polysilicon film having grains formed therein, the number of grains located on a straight line of an appropriate length is first obtained. From this length and the number of grains, an average number of grains per unit length (e.g., 1 μm) is obtained. The average grain size in the polysilicon film is obtained by calculating a reciprocal of the average number of grains.

Thereafter, prescribed impurity to become an emitter diffusion layer, e.g., arsenic (As) or phosphorus (P), is implanted into polysilicon film 10 under the conditions of implant energy of 30 KeV to 60 KeV and a dose of $1\times10^{15}/cm^2$ to $1\times10^{16}/cm^2$ (emitter implantation).

Figure 9:
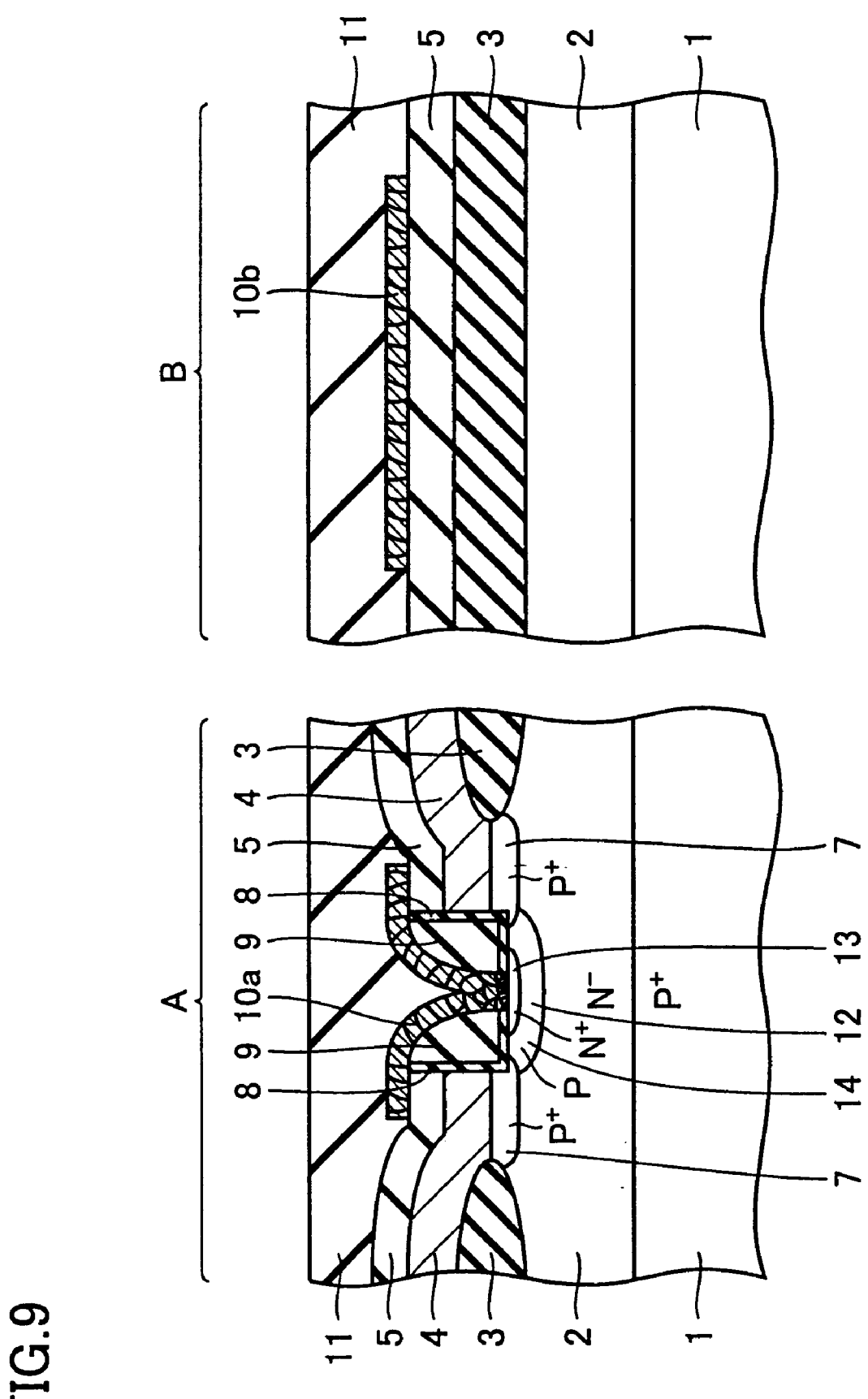

As shown in FIG. 9, polysilicon film 10 is subjected to prescribed patterning to form an emitter extracting electrode 10a in element forming region A, and to form a resistance element 10b in peripheral region B.

An interlayer silicon oxide film 11 of a film thickness of about 300–1000 nm (3000–10000 Å) is formed by CVD to cover emitter extracting electrode 10a and resistance element 10b.

Next, a heat treatment is conducted at a temperature of, e.g., 800–900° C. for about an hour. Thus, in element forming region A, boron or the like implanted for the intrinsic base implantation is diffused to form an intrinsic base diffusion layer 12. Further, boron or the like implanted for the link base implantation is diffused to form a link base diffusion layer 14, so that external base diffusion layer 7 and intrinsic base diffusion layer 12 are linked to each other. In addition, arsenic implanted for the emitter implantation is diffused, so that an emitter diffusion layer 13 is formed.

In peripheral region B, arsenic implanted into resistance element 10b for the emitter implantation attains a state (activated state) contributing to conductivity.

Figure 10:
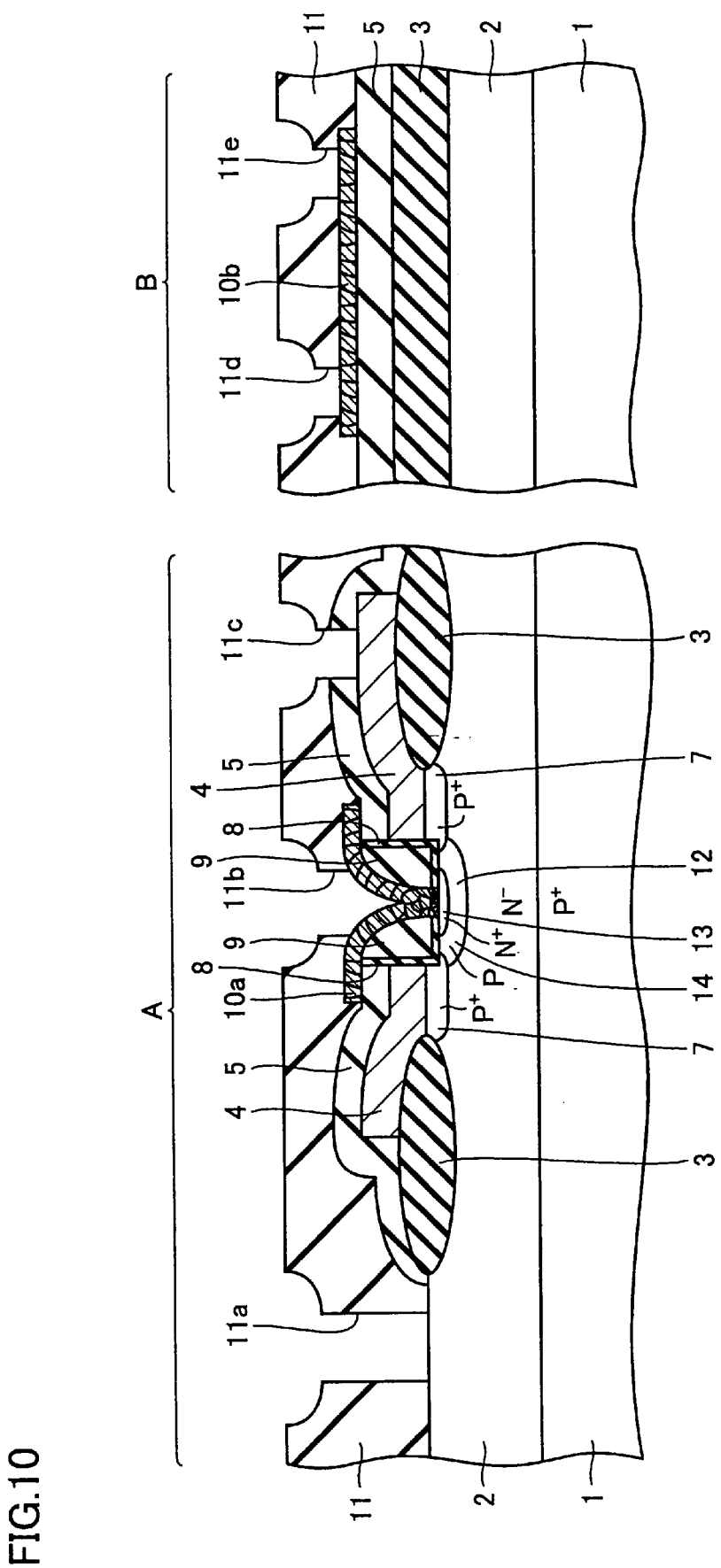
Figure 11:
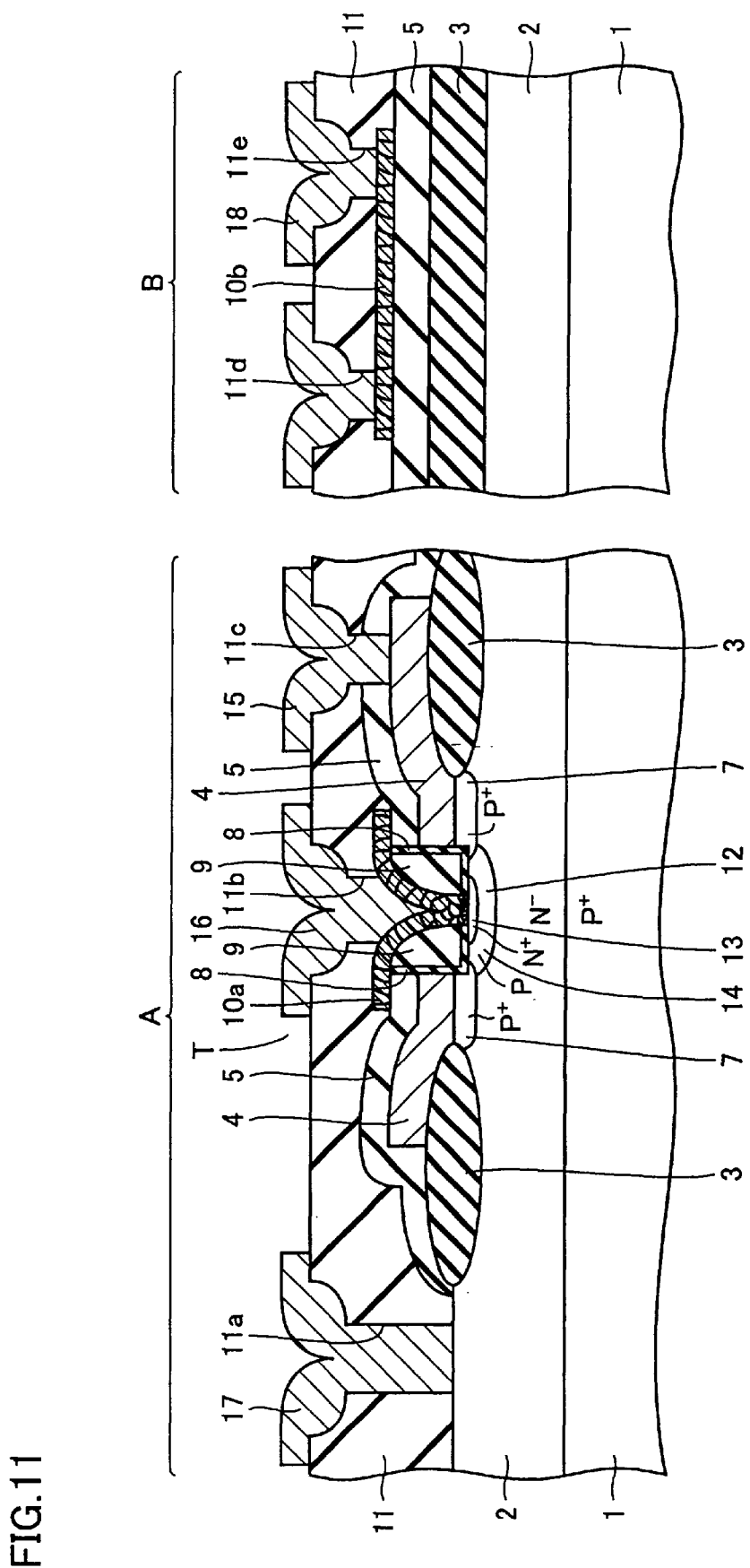

Next, as shown in FIG. 10, interlayer silicon oxide film 11 is subjected to prescribe etching to form prescribed contact holes 11a–11e. Next, as shown in FIG. 11, an aluminum film (not shown) is formed by sputtering, for example, to fill contact holes 11a–11e.

The aluminum film is subjected to prescribed patterning. Thus, in element forming region A, a collector electrode 17 to be connected to N⁻ epitaxial layer 2 is formed in contact hole 11a, an emitter electrode 16 to be connected to emitter extracting electrode 10a is formed in contact hole 11b, and a base electrode 15 to be connected to external base extracting electrode 4 is formed in contact hole 11c.

In peripheral region B, an electrode 18 to be connected to resistance element 10b is formed in each contact hole lid, lie. The semiconductor device having a bipolar transistor T formed in element forming region A is thus obtained.

According to the manufacturing method as described above, the exposed surface of N⁻ epitaxial layer 2 suffers damages from the implanting, etching and plasma processing in the step shown in FIG. 7, and more crystal defects are produced therein.

Figure 12:
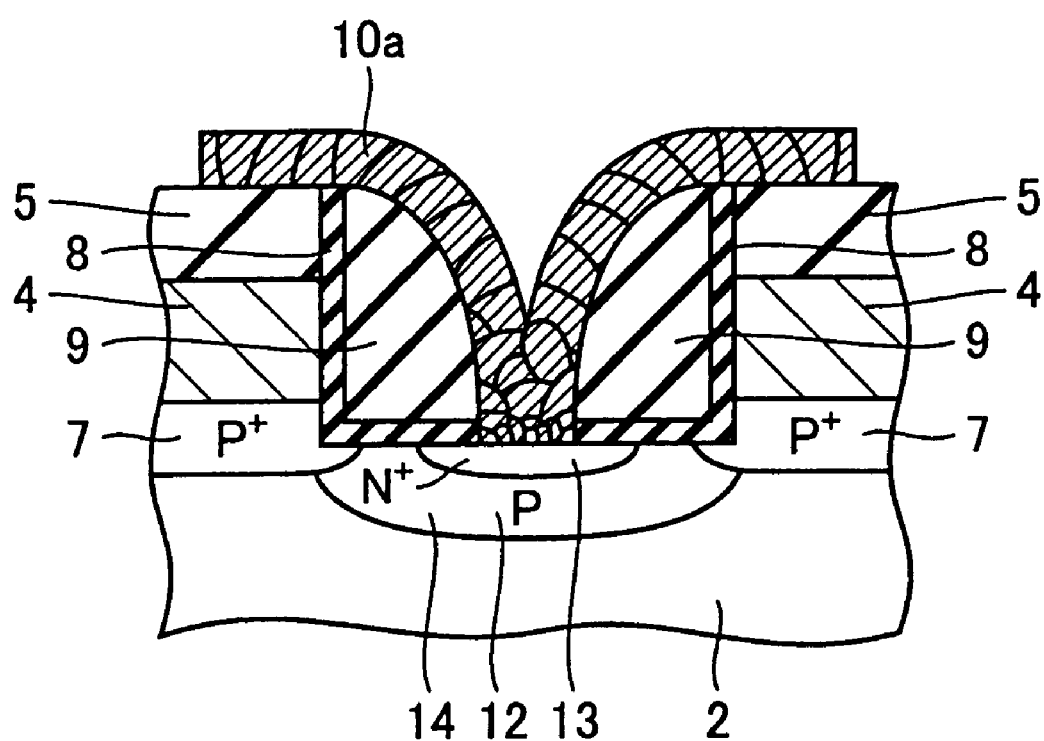
FIG. 12 is a partially enlarged cross sectional view showing the emitter extracting electrode of the first embodiment.

Thus, even if polysilicon film 10 is subsequently formed under the conditions causing the grain size to increase, the grain size becomes relatively small in the portion of polysilicon film 10 located in the vicinity of the exposed surface of N⁻ epitaxial layer 2, as shown in FIG. 12, because of the crystal defects produced in the surface of N⁻ epitaxial layer 2.

By comparison, in the portions of polysilicon film 10 located on silicon oxide film 5 and in peripheral region B (see FIG. 11), the grain size becomes sufficiently larger than that in the portion of polysilicon film 10 located in the vicinity of the exposed surface of N⁻ epitaxial layer 2, since they are uninfluenced by the crystal defects.

As such, the number of grains contacting the exposed surface of N⁻ epitaxial layer 2 becomes greater than the conventional case, and the grain boundaries contacting the relevant surface also increases. As a result, the impurity for formation of emitter diffusion layer 13 diffuses from polysilicon film 10 through the surface of N⁻ epitaxial layer 2 sufficiently down to a prescribed depth, so that emitter diffusion layer 13 having a desired depth is formed. Accordingly, in the semiconductor substrate having the bipolar transistor, the leakage of the base current, reduction of current gain fFE, reduction of breakdown voltage between emitter and base, and others can be suppressed.

On the other hand, in the portion of polysilicon film 10 located on silicon oxide film 5, the grain size is relatively large. This decreases variation in resistance value of resistance element 10b formed from this portion, and thus, high-precision resistance element 10b is obtained.

As such, although the condition of grain size required for emitter extracting electrode 10a and the condition of grain size required for resistance element 10b are contradictory to each other, the crystal defects are utilized in formation of polysilicon film 10 to change the grain sizes in different portions thereof. Accordingly, it is possible to optimize the grain size conditions required for both emitter extracting electrode 10a and resistance element 10b.

Second Embodiment

Figure 13:
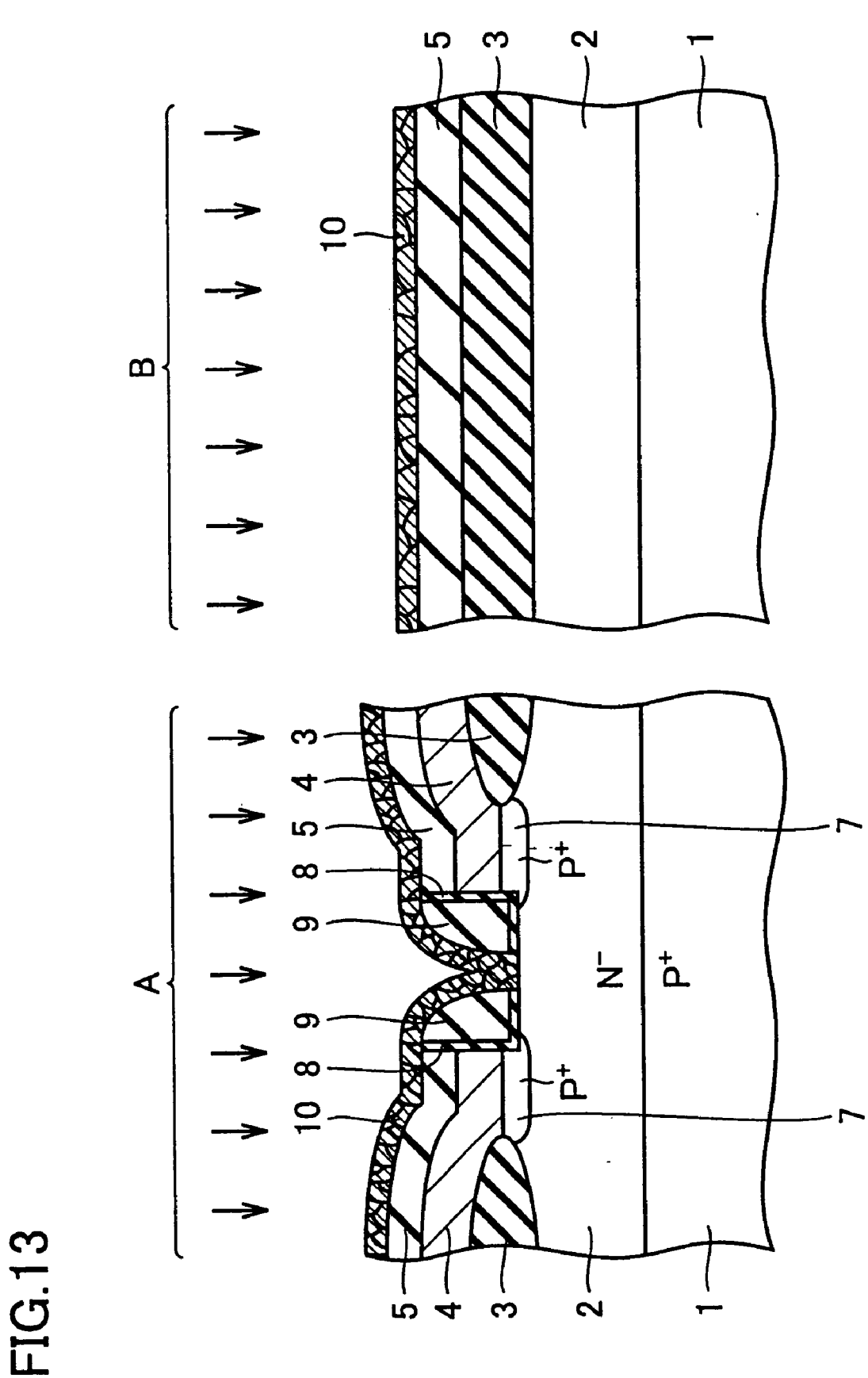
FIG. 13 is a cross sectional view showing a step in manufacturing a semiconductor device according to a second embodiment of the present invention.

The manufacturing method of a semiconductor device according to the second embodiment of the present invention is now described. The steps shown in FIGS. 1–6 of the first embodiment are conducted first. Next, as shown in FIG. 13, a polysilicon film (or amorphous silicon film) 10 of a film thickness of about 100–400 nm (1000–4000 Å) is formed on silicon oxide film 5 by CVD, at a relatively high temperature of, e.g., 600–800° C.

This deposition condition is to cause the grain size of polysilicon film 10 to become relatively small, since it is desirable that the grain size is reduced with respect to the surface of N⁻ epitaxial layer 2 exposed in the step of forming sidewall oxide film 9 (see FIG. 6).

Figure 14:
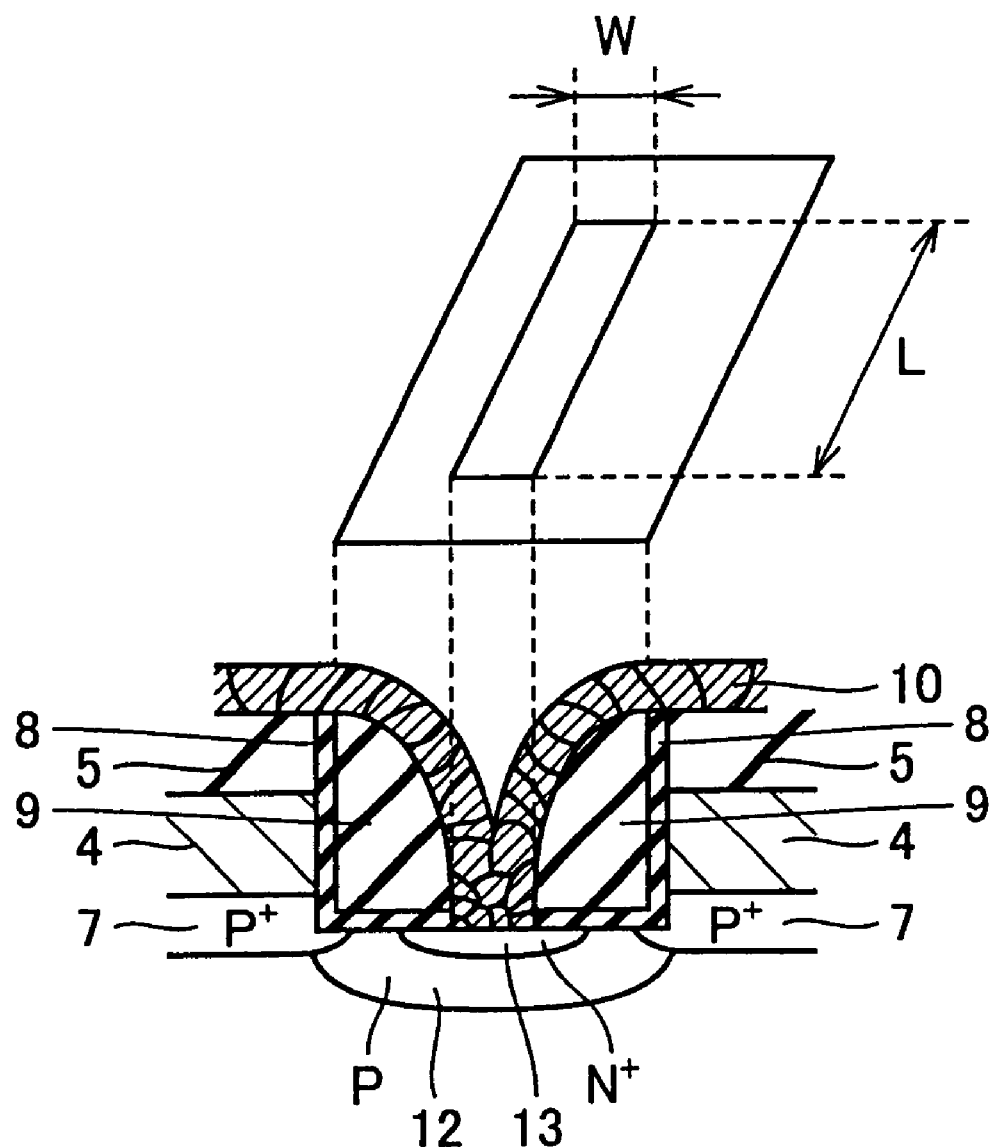
FIG. 14 is a partially cross sectional perspective view illustrating the emitter size in the second embodiment.

The size of this exposed region of N⁻ epitaxial layer 2 is called an emitter size, because the impurity diffuses from the surface of the relevant region to form the emitter diffusion layer. In this case, as shown in FIG. 14, the emitter size is defined as width W×depth L. The grain size is preferably smaller than the shorter side, i.e., width W, of the emitter size.

Figure 15:
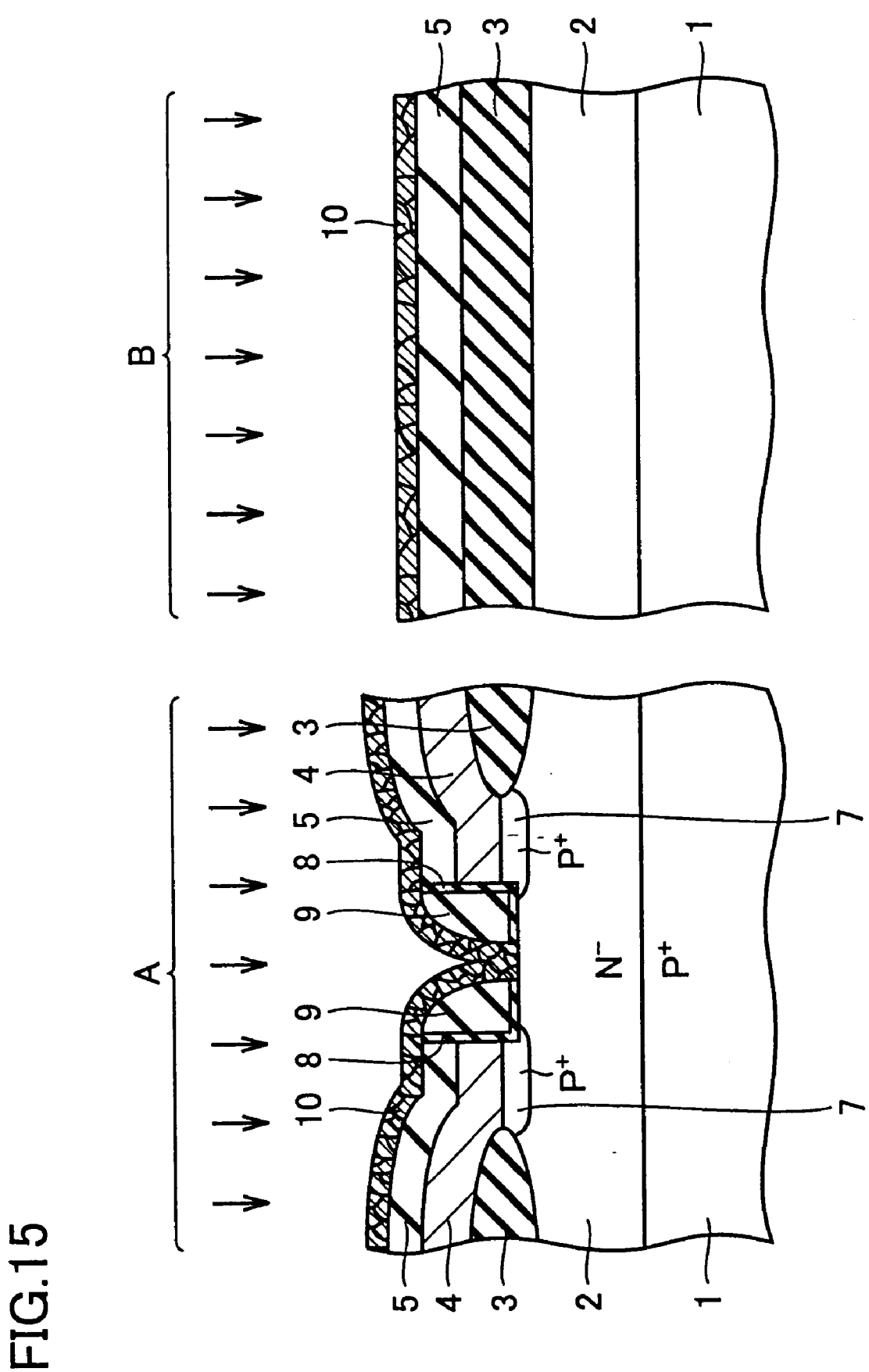
FIGS. 15 and 16 are cross sectional views showing successive steps conducted following the step shown in FIG. 13 in the second embodiment.

Thereafter, as shown in FIG. 15, prescribed impurity to become an emitter diffusion layer, e.g., arsenic (As) or phosphorus (P), is implanted into polysilicon film 10 under the conditions of implant energy of 30 KeV to 60 KeV and a dose of $1\times10^{15}/cm^2$ to $1\times10^{16}/cm^2$.

Next, prescribed impurity for promoting growth of grains, e.g., nickel (Ni), is implanted into polysilicon film 10 under the conditions of implant energy of 5 KeV to 30 KeV and a dose of $1\times10^{12}/cm^2$ to $1\times10^{16}/cm^2$. At this time, nickel is sufficiently implanted into a portion of polysilicon film 10 located on silicon oxide film 5, while it is hardly implanted into a portion of polysilicon film 10 located near the lower portion of sidewall oxide film 9, since it is located at the bottom of the concave portion.

Figure 16:
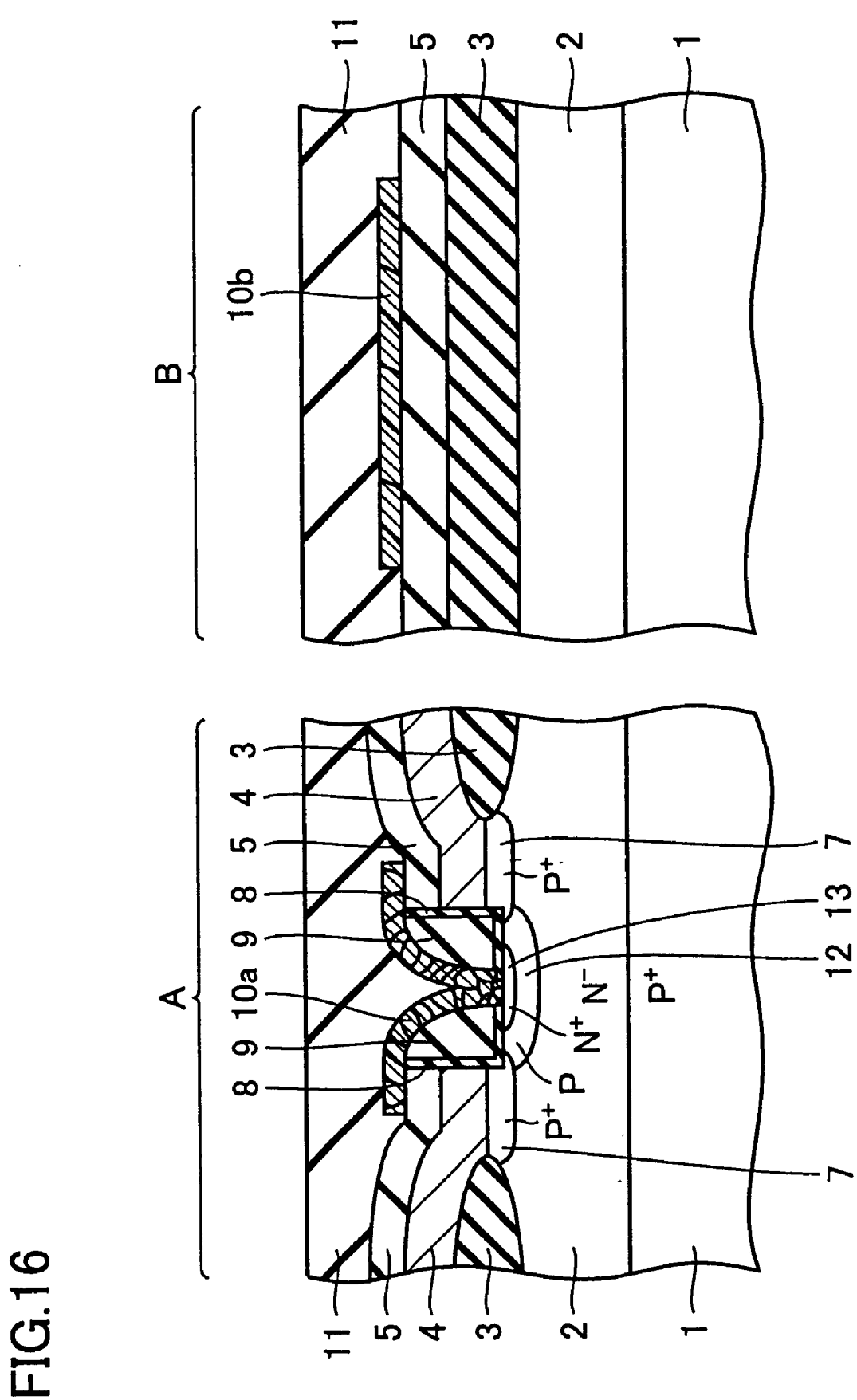

Polysilicon film 10 is then subjected to prescribed patterning, and an emitter extracting electrode 10a and a resistance element 10b are formed in element forming region A and peripheral region B, respectively, as shown in FIG. 16.

An interlayer silicon oxide film 11 of a film thickness of about 300–1000 nm (3000–10000 Å) is formed by CVD to electrode 10a and resistance element 10b.

Next, a heat treatment is conducted at a temperature of, e.g., 800–900° C. for about an hour. Thus, in element forming region A, boron or the like implanted for the intrinsic base implantation diffuses to form an intrinsic base diffusion layer 12. Arsenic implanted for the emitter implantation also diffuses, so that an emitter diffusion layer 13 is formed.

In peripheral region B, arsenic implanted into resistance element 10b for the emitter implantation attains a state (activated state) contributing to conductivity.

Figure 17:
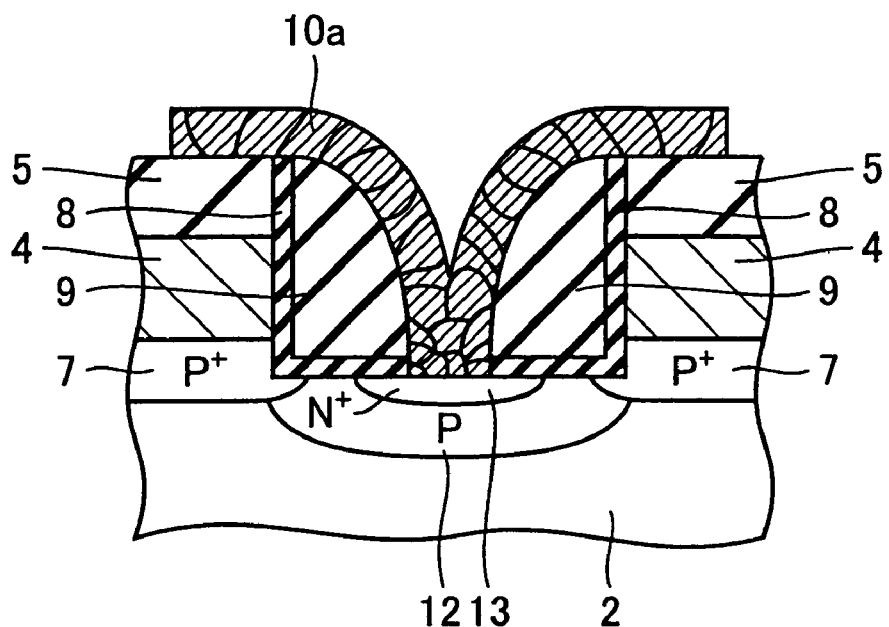
FIG. 17 is a partially enlarged cross sectional view showing the emitter extracting electrode of the second embodiment.
Figure 18:
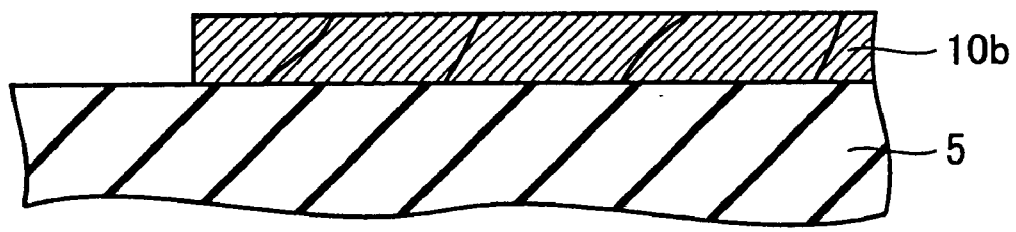
FIG. 18 is a partially enlarged cross sectional view showing the resistance element of the second embodiment.
Figure 19:
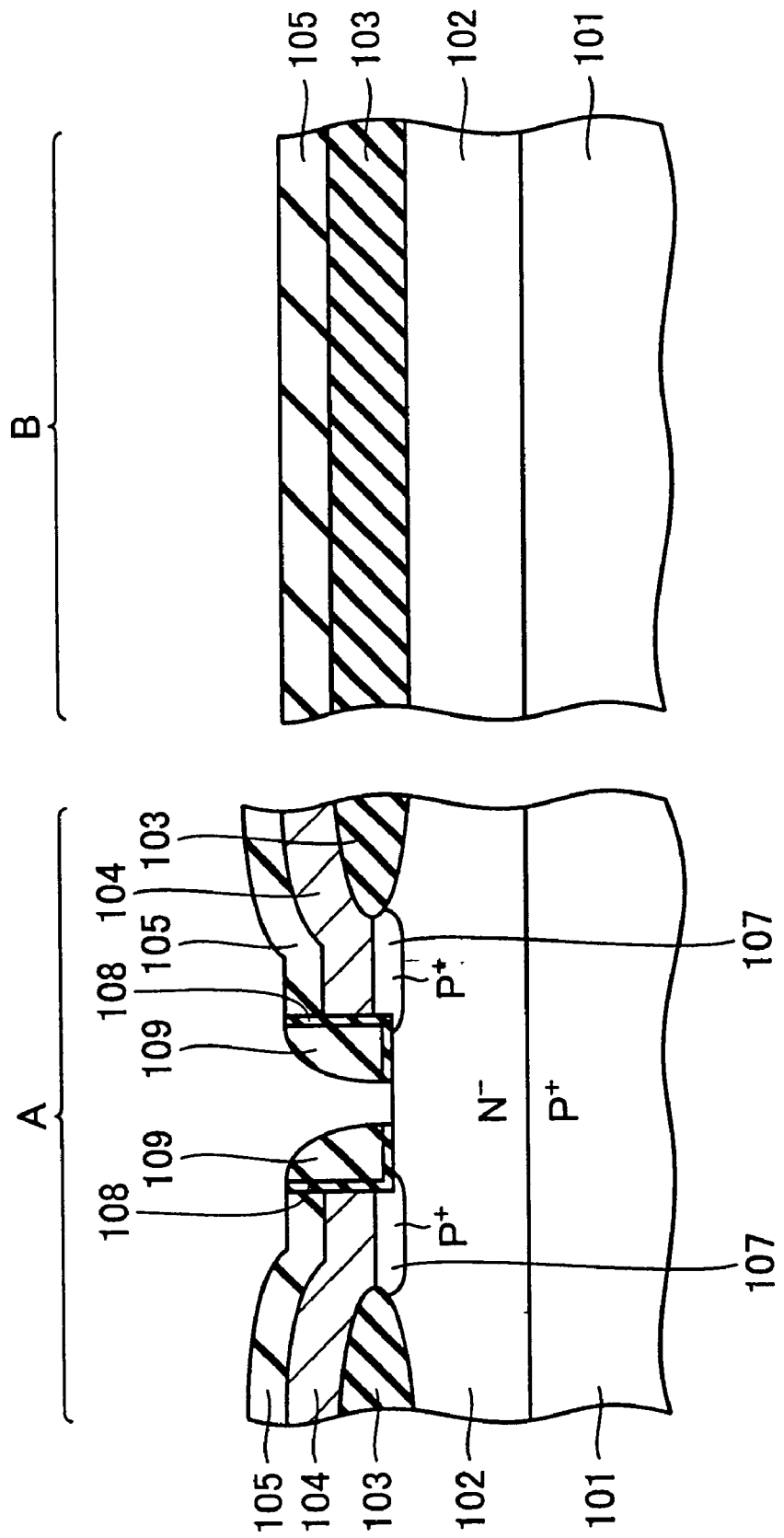
FIGS. 19, 20, 21, 22, and 23 are cross sectional views showing successive steps of a conventional method of manufacturing a semiconductor device.
Figure 20:
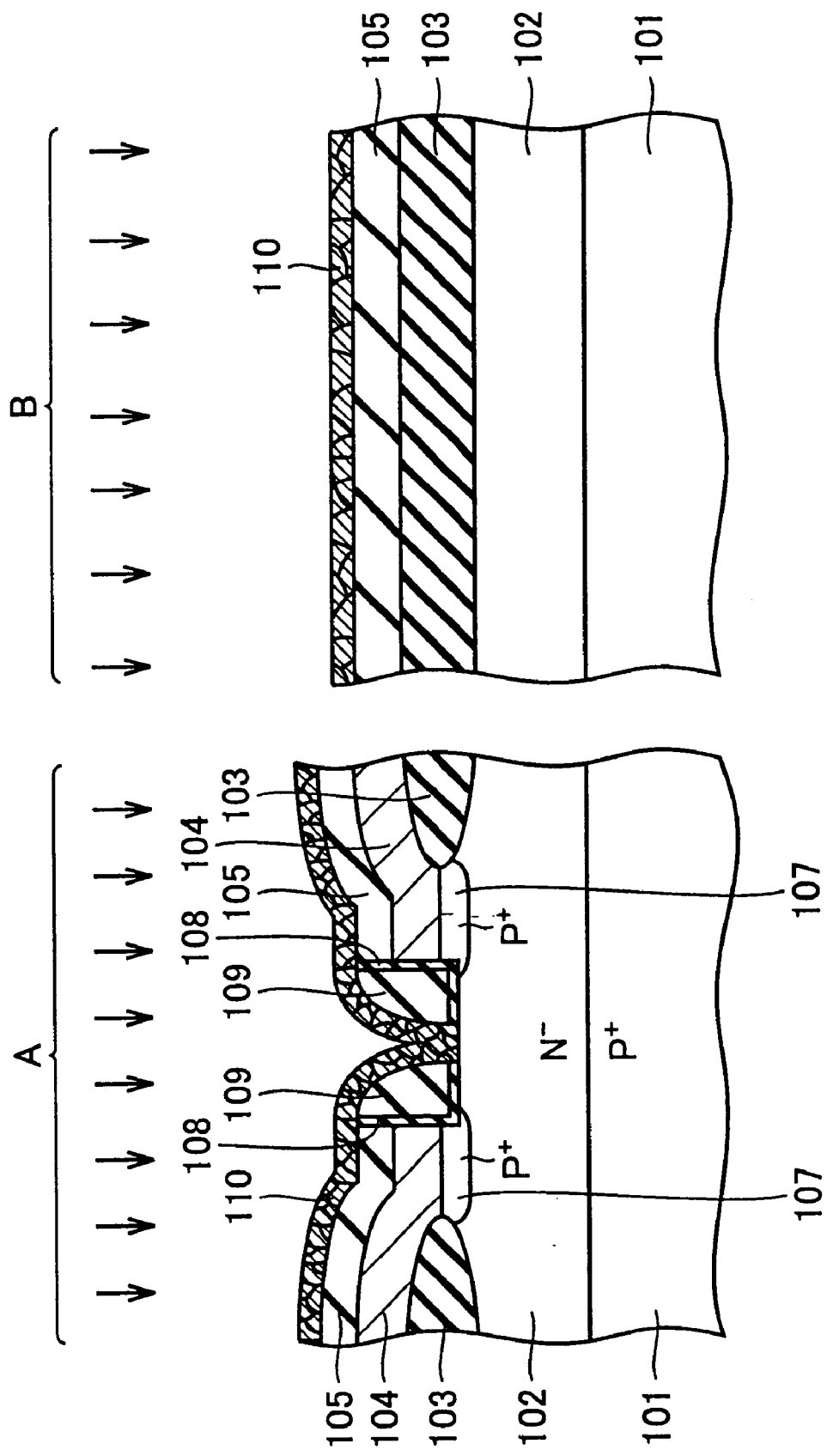
Figure 21:
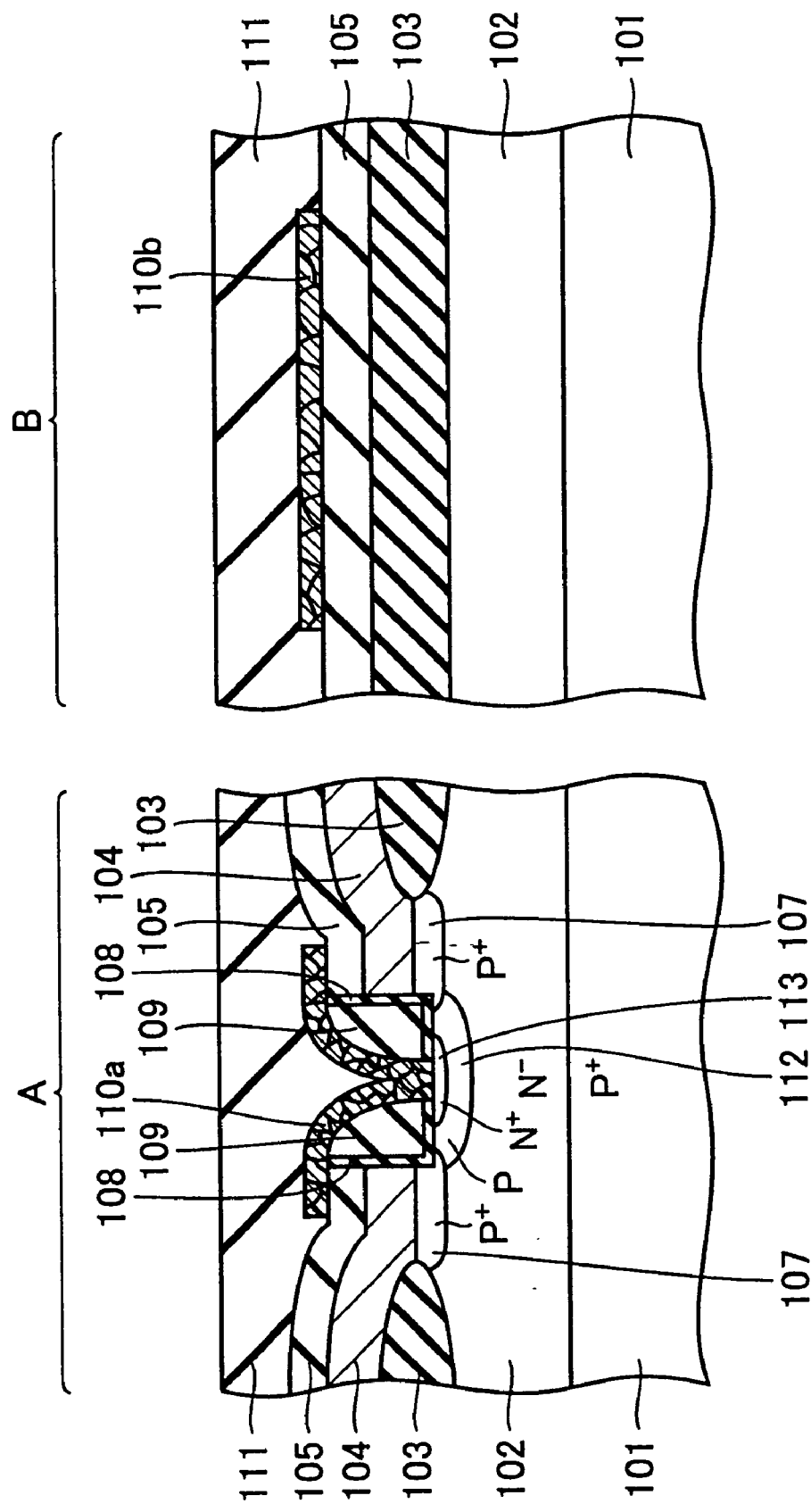
Figure 22:
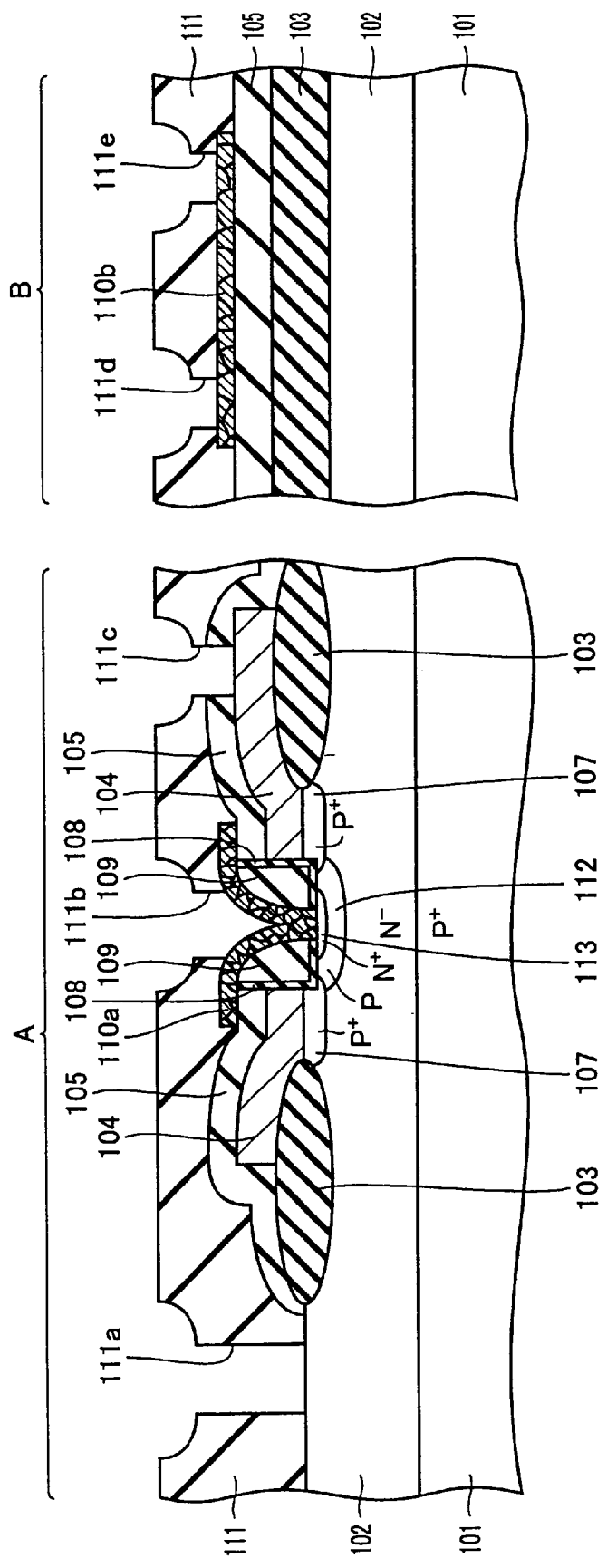
Figure 23:
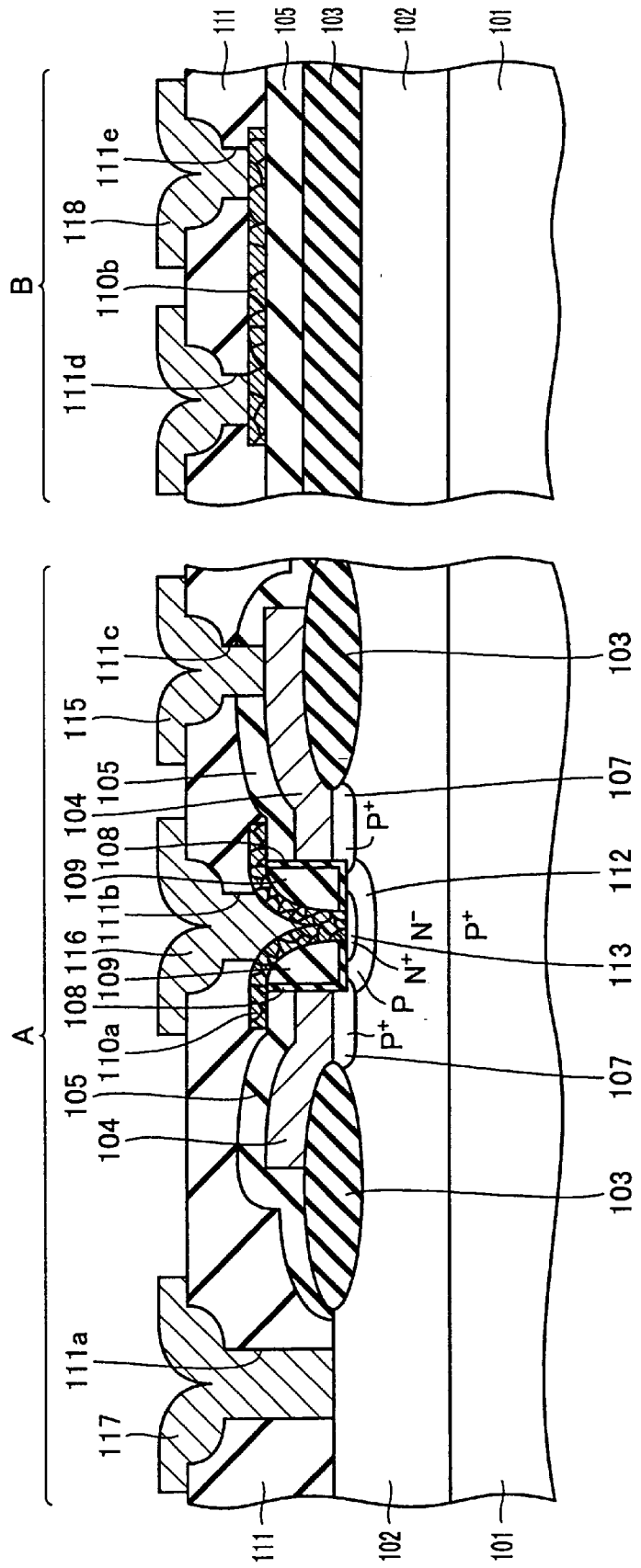
Figure 24:
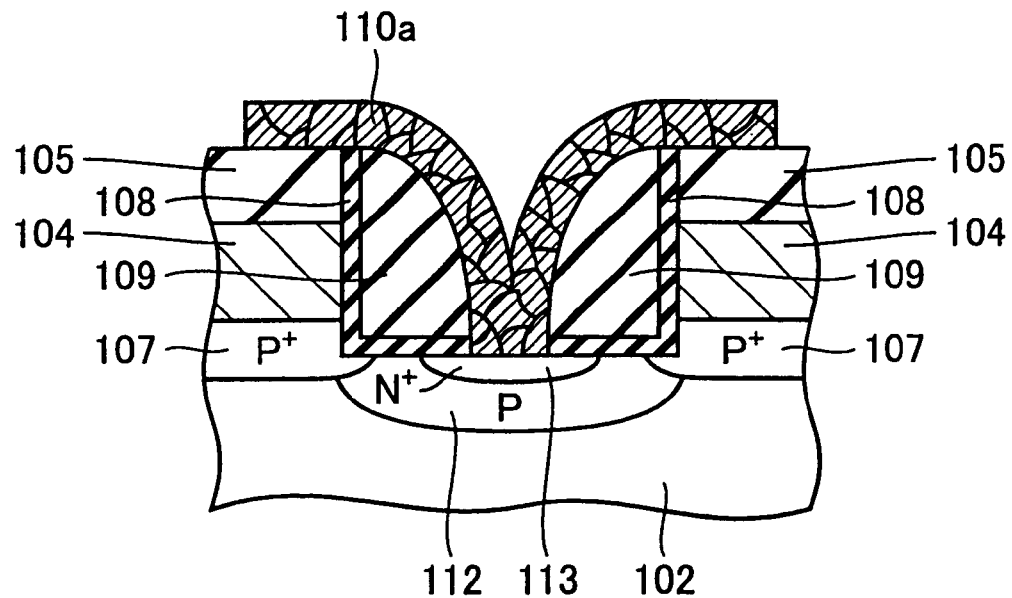
FIG. 24 is a partially enlarged cross sectional view showing the emitter extracting electrode of the conventional semiconductor device.
Figure 25:
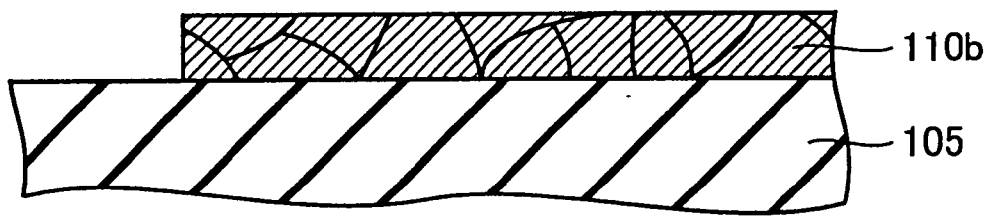
FIG. 25 is a partially enlarged cross sectional view showing the resistance element of the conventional semiconductor device.

As shown in FIGS. 17 and 18, in the portions corresponding to emitter extracting electrode 10a and resistance element 10b located on silicon oxide film 5, the grain size becomes relatively large, as the growth of the grains is promoted. Particularly, in these portions, it is desirable that one grain is formed in a film thickness direction.

On the other hand, in the portion of emitter extracting electrode 10a located near the lower portion of sidewall oxide film 9, the grain size becomes relatively small, as the growth of grains is not promoted.

Thereafter, the steps shown in FIGS. 10 and 11 in the first embodiment are conducted, and a semiconductor device having a bipolar transistor T formed in element forming region A and resistance element 10b formed in peripheral region B is obtained.

According to the manufacturing method as described above, in the step shown in FIG. 13, polysilicon film 10 is formed under the conditions causing the grain size to become relatively small. Prescribed impurity for promoting growth of grains, e.g., nickel (Ni), is then implanted into the polysilicon film 10.

At this time, nickel is implanted sufficiently into the portion of polysilicon film 10 located on silicon oxide film 5, while nickel is hardly implanted into the portion of polysilicon film 10 located near the lower portion of sidewall oxide film 9, i.e., at the bottom of the concave portion.

Thus, the growth of the grains is promoted by the subsequent heat treatment in the portions of emitter extracting electrode 10a and resistance element 10b located on silicon oxide film 5, so that the grain size becomes relatively large therein.

On the other hand, in the portion of emitter extracting electrode 10a located near the lower portion of sidewall oxide film 9, the growth of the grains is not promoted, so that the grain size remains relatively small.

As such, the number of grains located in the exposed surface of N⁻ epitaxial layer 2 becomes greater than in the case of the conventional semiconductor device, and the grain boundaries contacting the exposed surface of N⁻ epitaxial layer 2 increase. As a result, the impurity implanted into polysilicon film 10 for formation of emitter diffusion layer 13 diffuses from the exposed surface of N⁻ epitaxial layer 2 sufficiently down to a prescribed depth, so that emitter diffusion layer 13 having a desired depth is formed. Accordingly, the leakage of the base current, reduction of current gain hFE and a decrease of breakdown voltage between emitter and base can be suppressed in the semiconductor device having the bipolar transistor.

On the other hand, in the portion of polysilicon film 10 located on silicon oxide film 5, the grains grow and the grain size becomes relatively large. Thus, resistance element 10b formed from this portion is reduced in variation of resistance value, so that high-precision resistance element 10b is obtained.

As described above, despite the contradictory grain size conditions required for emitter extracting electrode 10a and for resistance element 10b, the growth of grains after formation of polysilicon film 10 is partially restricted to obtain different grain sizes in different portions thereof, so that the grain size conditions required for both emitter extracting electrode 10a and resistance element 10b can be optimized.

Although the impurity for use in promoting the growth of grains has been described as nickel in this embodiment, other transition metals such as cobalt (Co), iron (Fe), copper (Cu), palladium (Pd), platinum (Pt), gold (Au), and indium (In) may be implanted.

In the respective embodiments, a semiconductor device provided with a bipolar transistor has been described by way of example as the semiconductor device to which the present invention is applied. However, not limited thereto, the present invention has wide applications in the case where prescribed impurity having been implanted into a polycrystal film such as a polysilicon film is diffused into an impurity region of a conductivity type in a semiconductor substrate to form another impurity region of the other conductivity type, wherein the another impurity region can be formed with a desired depth.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a first impurity region of a first conductivity type at a main surface of and in a semiconductor substrate;
   a second impurity region of a second conductivity type in said semiconductor substrate at a surface of said first impurity region and surrounded by said first impurity region from below, relative to the main surface of said semiconductor substrate, and from all sides;
   an insulating film on said semiconductor substrate covering said first impurity region and said second impurity region;
   an opening in said insulating film exposing a surface of said second impurity region; and
   a conductive portion on said insulating film, filling the opening, and electrically connected to said second impurity region wherein said conductive portion is a polycrystalline film, and a portion of said polycrystalline film located at a bottom of the opening and contacting the surface of said second impurity region has a grain size smaller than grain size of a portion of said polycrystalline film located on an upper surface of said insulating film.

2. The semiconductor device according to claim 1, wherein
   the opening has a width and a depth greater than the width, and
   grain size in said portion contacting the surface of said second impurity region is smaller than the width.

3. The semiconductor device according to claim 2, comprising a resistance element on said insulating film that is part of the same layer as said conductive portion, said resistance element including a single grain in a film thickness direction.

4. The semiconductor device according to claim 3, comprising a third impurity region of the second conductivity type at the main surface of said semiconductor substrate and surrounding said first impurity region from below and from all sides.

5. The semiconductor device according to claim 2, comprising a third impurity region of the second conductivity type at the main surface of said semiconductor substrate and surrounding said first impurity region from below and from all sides.

6. The semiconductor device according to claim 1, comprising a resistance element on said insulating film that is part of the same layer as said conductive portion, said resistance element including a single grain in a film thickness direction.

7. The semiconductor device according to claim 6, comprising a third impurity region of the second conductivity type at the main surface of said semiconductor substrate and surrounding said first impurity region from below and from all sides.

8. The semiconductor device according to claim 1, comprising a third impurity region of the second conductivity type at the main surface of said semiconductor substrate and surrounding said first impurity region from below and from all sides.

* * * * *